US012601807B2

(12) United States Patent
Hellwig et al.

(10) Patent No.: US 12,601,807 B2
(45) Date of Patent: Apr. 14, 2026

(54) PROCESS AND SYSTEM FOR CHARACTERIZING A FIXTURE COMPONENT OF A TEST FIXTURE

(71) Applicant: Rohde & Schwarz GmbH & Co. KG, Munich (DE)

(72) Inventors: Mathias Hellwig, Emmering (DE); Benedikt Lippert, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 283 days.

(21) Appl. No.: 18/320,358

(22) Filed: May 19, 2023

(65) Prior Publication Data

US 2024/0385275 A1 Nov. 21, 2024

(51) Int. Cl.
| | |
|---|---|
| *G01R 35/00* | (2006.01) |
| *G01R 27/32* | (2006.01) |
| *G01R 31/28* | (2006.01) |

(52) U.S. Cl.
CPC ........... *G01R 35/007* (2013.01); *G01R 27/32* (2013.01); *G01R 31/2822* (2013.01)

(58) Field of Classification Search
CPC ... G01R 35/007; G01R 27/32; G01R 31/2822
See application file for complete search history.

(56) References Cited

U.S. PATENT DOCUMENTS

| | | | | |
|---|---|---|---|---|
| 9,086,376 | B1 * | 7/2015 | Dunsmore | G01R 27/32 |
| 11,006,288 | B1 * | 5/2021 | Tsironis | G06F 30/18 |
| 2009/0184721 | A1 * | 7/2009 | Albert-Lebrun | G01R 27/32 |
| | | | | 324/601 |
| 2012/0326737 | A1 * | 12/2012 | Wen | G01R 35/005 |
| | | | | 324/750.01 |
| 2013/0293249 | A1 * | 11/2013 | Han | G01R 31/2822 |
| | | | | 324/750.02 |
| 2019/0377007 | A1 * | 12/2019 | Mirkhani | G01R 31/2834 |
| 2019/0391193 | A1 * | 12/2019 | Spirito | G01R 27/28 |

* cited by examiner

*Primary Examiner* — Akm Zakaria
(74) *Attorney, Agent, or Firm* — Studebaker Brackett PLLC

(57) ABSTRACT

Disclosed is a process for characterizing a fixture component of a test fixture. The fixture component comprises a test instrument interface and a device under test, DUT, interface. The process comprises connecting a test instrument to the test instrument interface; sequentially establishing a plurality of characterization setups for the fixture component; and characterizing at least one scattering, S, parameter of the respectively established characterization setup. The establishing respectively comprises one of: providing an open circuit at the DUT interface, providing a short circuit at the DUT interface, providing a further fixture component of the test fixture at the DUT interface via mated connectors, and providing a DUT at the DUT interface. This avoids inaccuracies, high cost and availability issues in connection with lead-out structures of test fixtures.

8 Claims, 6 Drawing Sheets

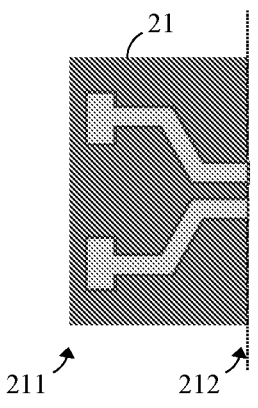
FIG. 8
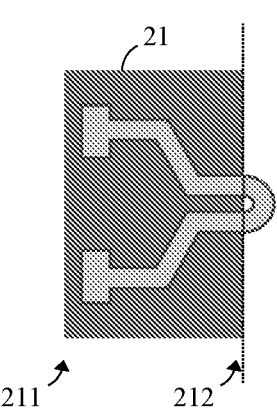
FIG. 9
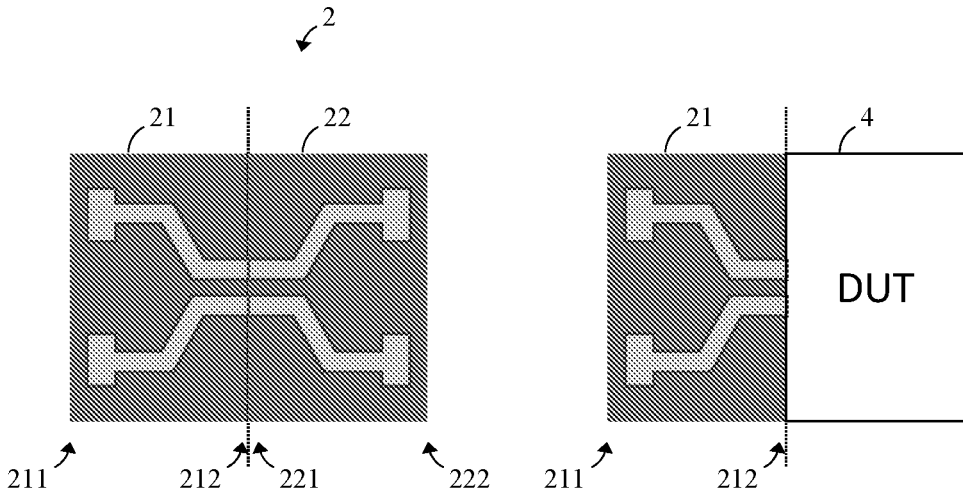
FIG. 10
FIG. 11

PROCESS AND SYSTEM FOR CHARACTERIZING A FIXTURE COMPONENT OF A TEST FIXTURE

TECHNICAL FIELD

The present disclosure relates to compensation of unwanted effects of test fixtures in radio frequency (RF) testing, and in particular to a process and a system for characterizing a fixture component of a test fixture.

BACKGROUND ART

High-Speed digital interfaces like USB, PCIe and HMDI are apparent on all commercial and industrial equipment, but many more interfaces are used inside and outside of digital systems. All these interfaces have the tendency to increase the speed and reduce the form factor from generation to generation. This puts a challenge on the test equipment to contact the interface and accurately acquire the signals for debug and compliance tests.

A test fixture is used to mediate between the signals of the specific interface of the device under test (DUT) on one side and the signals of a coaxial interface on the other side, corresponding to the coaxial interface of the test equipment.

At higher data rates the unwanted effects of these fixtures cannot be neglected anymore, particularly in the debug measurements and sometimes also in compliance test.

This concern may be addressed by characterization of the fixtures and de-embedding the characterized error models of the fixtures. De-embedding as used herein may refer to mathematically removing the fixtures' unwanted effects from raw measurements of the DUT.

However, particular characterization setups such as "2X-Thru" which require directly connected replicas of the lead-in and lead-out structures (i.e., "left" and "right" fixtures) enclosing the given DUT may suffer from poor electrical quality or even non-availability of a lead-out structure. Thus test engineers may be required to use a poor lead-out structure, if any, to evaluate the lead-in structure, with all its implications such as inaccuracies, high cost and availability issues.

SUMMARY

It is an object to overcome the above-mentioned and other drawbacks.

The foregoing and other objects are achieved by the features of the independent claims. Further implementation forms are apparent from the dependent claims, the description and the figures.

According to a first aspect, a process for characterizing a fixture component of a test fixture is provided. The fixture component comprises a test instrument interface and a device under test, DUT, interface. The process comprises connecting a test instrument to the test instrument interface; sequentially establishing a plurality of characterization setups for the fixture component; and characterizing at least one scattering, S, parameter of the respectively established characterization setup. The establishing respectively comprises one of: providing an open circuit at the DUT interface, providing a short circuit at the DUT interface, providing a further fixture component of the test fixture at the DUT interface via mated connectors, and providing a DUT at the DUT interface.

A "test fixture" as used herein may refer to a structure used to connect test equipment cables, typically coaxial, to a non-coaxial DUT. The fixture is in many cases constructed using a printed circuit board (PCB).

A "fixture component" as used herein may refer to a lead-in structure or a lead-out structure of a composite test fixture. Fixture components are also known as "test coupons".

"Sequentially" as used herein may refer to "in sequence" or "one by one".

A "characterization setup" as used herein may refer to a particular wiring configuration of a fixture component for an at least partial characterization of the fixture component.

A "scattering parameter" or "S-parameter" as used herein may refer to an entry of a typically complex-valued matrix that quantifies how RF energy propagates through a multi-port network at specified frequencies. Each entry of the matrix defines a ratio of an output voltage wave to an incident voltage wave for a given pair of input and output ports at a given frequency.

"Open circuit" and "short circuit" as used herein may refer to the electrical properties of the "open (circuit)" and "short (circuit)" calibration standards, respectively.

A "calibration standard" as used herein may refer to a device having known electrical properties and thus being used for calibration of test instruments.

A "calibration" as used herein may refer to a process of characterizing systematic errors of a test instrument by measuring calibration standards and mathematically removing the characterized systematic errors from the raw measurements.

A "device under test" or "DUT" as used herein may refer to an interconnect that is to be tested, such as a connector, a cable, a printed circuit board or an active electronic device.

The plurality may comprise two or more.

The plurality may comprise three or more.

Sequentially establishing a plurality of characterization setups for the fixture component may contain providing an open circuit at the DUT interface, and providing a further fixture component of the test fixture at the DUT interface via mated connectors.

Sequentially establishing a plurality of characterization setups for the fixture component may contain providing an open circuit at the DUT interface, providing a short circuit at the DUT interface, and providing a further fixture component of the test fixture at the DUT interface via mated connectors.

Sequentially establishing a plurality of characterization setups for the fixture component may contain providing an open circuit at the DUT interface, and providing a DUT at the DUT interface.

Sequentially establishing a plurality of characterization setups for the fixture component may contain providing an open circuit at the DUT interface, providing a short circuit at the DUT interface, and providing a DUT at the DUT interface.

The test instrument may comprise one of a vector network analyzer, VNA, and a time-domain reflectometer, TDR.

A "vector network analyzer" or "VNA" as used herein may refer to a test instrument that applies a stimulus signal to a DUT that is swept across a range of frequencies while the response of the DUT is measured.

A "time-domain reflectometer" or "TDR" as used herein may refer to a test instrument that applies a finite rise time step wave to a DUT while the response is measured in terms of impedance versus time or distance.

The DUT may comprise one of a printed circuit board, PCB, and an active electronic device.

A "printed circuit board" or "PCB" as used herein may refer to an electrically non-conductive plate having electrically conductive traces used to combine electronic components to an electric circuit.

The fixture component and the further fixture component may be identical.

The test instrument interface may comprise a coaxial connector.

The DUT interface may comprise one of an electrically conductive PCB trace and a non-coaxial connector.

A "non-coaxial connector" as used herein may refer to a high-speed digital interface such as USB, PCIe and HMDI.

According to a second aspect, a system for characterizing a fixture component of a test fixture is provided. The system comprises the fixture component; and a test instrument for characterizing at least one scattering, S, parameter of a plurality of sequentially established characterization setups for the fixture component.

The system may further comprise a power supply for supplying electrical power to a device under test, DUT.

BRIEF DESCRIPTION OF DRAWINGS

The above-described aspects and implementations will now be explained with reference to the accompanying drawings, in which the same or similar reference numerals designate the same or similar elements.

The drawings are to be regarded as being schematic representations, and elements illustrated in the drawings are not necessarily shown to scale. Rather, the various elements are represented such that their function and general purpose become apparent to those skilled in the art.

FIGS. 8-11 illustrate various characterization setups for the fixture component of FIG. 7.

DETAILED DESCRIPTIONS OF DRAWINGS

In the following description, reference is made to the accompanying drawings, which form part of the disclosure, and which show, by way of illustration, specific aspects of implementations of the present disclosure or specific aspects in which implementations of the present disclosure may be used. It is understood that implementations of the present disclosure may be used in other aspects and comprise structural or logical changes not depicted in the figures. The following detailed description, therefore, is not to be taken in a limiting sense, and the scope of the present disclosure is defined by the appended claims.

For instance, it is understood that a disclosure in connection with a described method may also hold true for a corresponding apparatus or system configured to perform the method and vice versa. For example, if one or a plurality of specific method steps are described, a corresponding device may include one or a plurality of units, e.g. functional units, to perform the described one or plurality of method steps (e.g. one unit performing the one or plurality of steps, or a plurality of units each performing one or more of the plurality of steps), even if such one or more units are not explicitly described or illustrated in the figures. On the other hand, for example, if a specific apparatus is described based on one or a plurality of units, e.g. functional units, a corresponding method may include one step to perform the functionality of the one or plurality of units (e.g. one step performing the functionality of the one or plurality of units, or a plurality of steps each performing the functionality of one or more of the plurality of units), even if such one or plurality of steps are not explicitly described or illustrated in the figures. Further, it is understood that the features of the various exemplary implementations and/or aspects described herein may be combined with each other, unless specifically noted otherwise.

Figure 1:
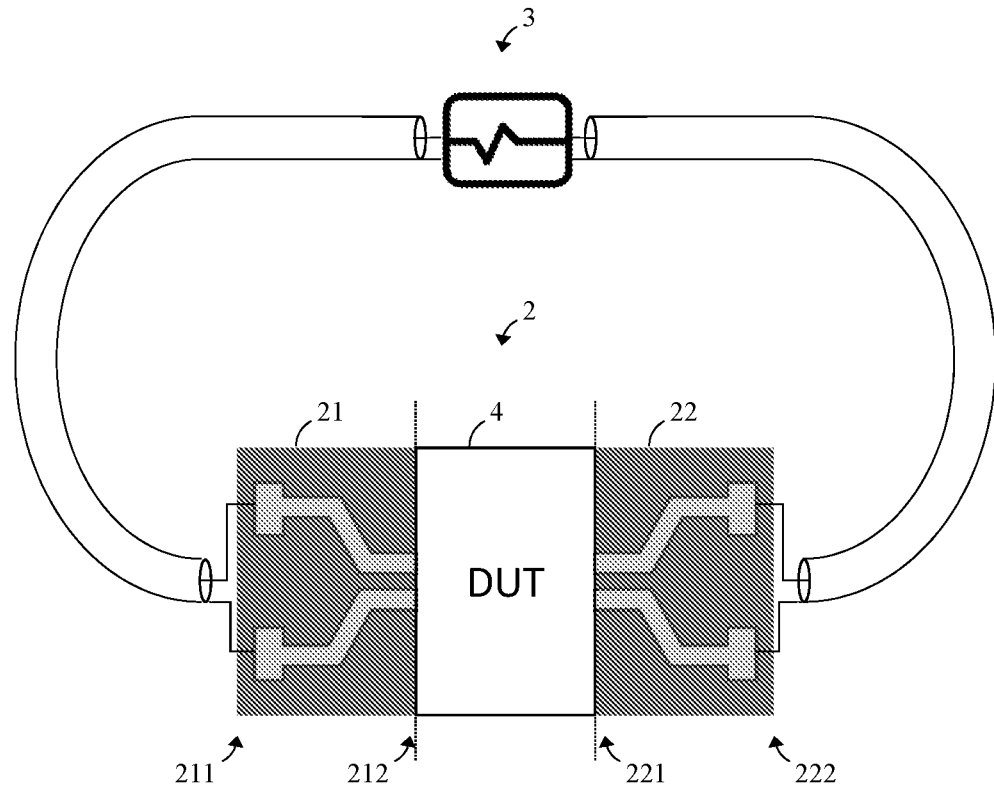
FIG. 1 illustrates a system for characterizing a DUT using a test fixture.

FIG. 1 illustrates a system for characterizing a device under test, DUT, 4 using a test fixture 2.

The system comprises a test instrument 3, which may comprise one of a vector network analyzer (VNA) and a time-domain reflectometer (TDR) for example. AVNA is configured to apply a stimulus signal to a device under test (DUT) 4 that is swept across a range of frequencies while the response of the DUT 4 is measured, whereas a TDR is configured to apply a finite rise time step wave to the DUT 4 while the response is measured in terms of impedance versus time or distance.

The DUT 4 may, for example, comprise one of a printed circuit board (PCB) and an active electronic device.

As shown in FIG. 1, the test fixture 2 may comprise fixture components 21, 22 which may enclose the DUT 4. The fixture components 21, 22 may be identical.

The respective fixture component 21, 22 comprises a test instrument interface 211, 222 and a DUT interface 212, 221.

The respective test instrument interface 211, 222 may comprise a coaxial connector, whereas the respective DUT interface 212, 221 may comprise one of a PCB trace and a non-coaxial connector.

The test fixture 2 may thus be configured to mediate between the signals of a DUT-specific interface 212, 221 and the signals of a coaxial interface 211, 222, corresponding to a coaxial interface of the test instrument 3.

At higher data rates the unwanted effects of the test fixture 2 cannot be neglected anymore, particularly in debug measurements and sometimes also in compliance test.

This concern may be addressed by characterization of the test fixture 2 and de-embedding the characterized error model of the test fixture 2. In other words, the test fixtures' 2 character/effects may be mathematically removed from raw measurements of the DUT 4, so that a reference plane (i.e., the plane at which the measurement is typically made) moves from the test instrument interfaces 211, 222 to the DUT interfaces 212, 221.

Figure 2:
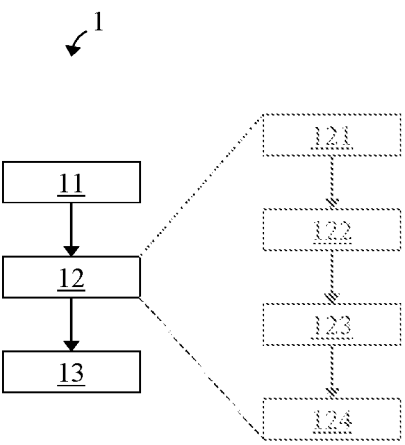
FIG. 2 illustrates a flow chart of a process for characterizing a fixture component of a test fixture.

FIG. 2 illustrates a flow chart of a process 1 for characterizing a fixture component 21, 22 of a test fixture 2.

The process 1 comprises a step of connecting 11 a test instrument 3 to the test instrument interface 211, 222 of the fixture component 21, 22.

The test instrument 3 may comprise one of a vector network analyzer, VNA, and a time-domain reflectometer, TDR.

The test instrument interface 211, 222 may comprise a coaxial connector.

The process 1 further comprises a step of sequentially establishing 12 a plurality of characterization setups for the fixture component 21, 22.

More specifically, the establishing 12 respectively comprises one of: providing 121 an open circuit at a DUT interface 212, 221 of the fixture component 21, 22, providing 122 a short circuit at the DUT interface 212, 221, providing 123 a further fixture component 22, 21 of the test fixture 2 at the DUT interface 212, 221 via mated connectors 213, 223, and providing 124 a DUT 4 at the DUT interface 212, 221.

The DUT interface 212, 221 may comprise one of a PCB trace, and a non-coaxial connector.

The plurality of the characterization setups may comprise two or more, in accordance with FIGS. 3-6 see below, and three or more in accordance with FIGS. 4 and 6 see below.

In other words, different combinations for different needs are possible. Note that not all of these characterization setups are necessary for generation of an error model.

The process 1 further comprises a step of characterizing 13 at least one scattering parameter (S-parameter) of the respectively established characterization setup.

FIGS. 3-6 illustrate various implementations of the process 1 of FIG. 2 for characterizing a fixture component 21, 22 of a test fixture 2.

Figure 3:
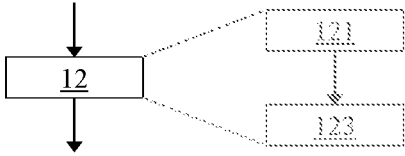
FIGS. 3-6 illustrate various implementations of the process of FIG. 2 for characterizing a fixture component of a test fixture.

FIG. 3 shows sequentially establishing 12 a plurality of characterization setups for the fixture component 21, 22 may contain providing 121 an open circuit at the DUT interface 212, 221, and providing 123 a further fixture component 22, 21 of the test fixture 2 at the DUT interface 212, 221 via mated connectors 213, 223.

This sequence of characterization setups requires no short circuit but two fixture components 21, 22. The sequence suffers from lower accuracy.

Figure 4:
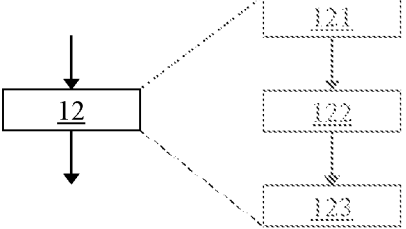

FIG. 4 shows sequentially establishing 12 a plurality of characterization setups for the fixture component 21, 22 may contain providing 121 an open circuit at the DUT interface 212, 221, providing 122 a short circuit at the DUT interface 212, 221, and providing 123 a further fixture component 22, 21 of the test fixture 2 at the DUT interface 212, 221 via mated connectors 213, 223.

This sequence of characterization setups requires a short circuit and two fixture components 21, 22, but no power supply or start-up. The sequence allows for higher accuracy and model generation for both fixture components 21, 22 (i.e., lead-in and lead-out structures).

Figure 5:
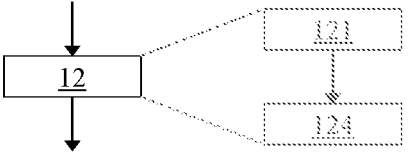

FIG. 5 shows sequentially establishing 12 a plurality of characterization setups for the fixture component 21, 22 may contain providing 121 an open circuit at the DUT interface 212, 221, and providing 124 a DUT 4 at the DUT interface 212, 221.

This sequence of characterization setups requires no short circuit but might require a special start-up for reception (RX). The sequence suffers from lower accuracy.

Figure 6:
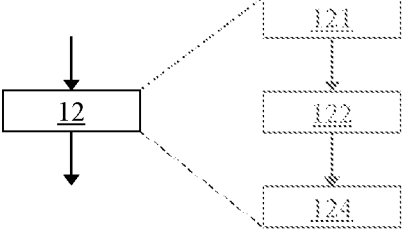

FIG. 6 shows sequentially establishing 12 a plurality of characterization setups for the fixture component 21, 22 may contain providing 121 an open circuit at the DUT interface 212, 221, providing 122 a short circuit at the DUT interface 212, 221, and providing 124 a DUT 4 at the DUT interface 212, 221.

This sequence of characterization setups requires a short circuit, and might require power for the DUT 4 and/or a special start-up for RX. The sequence allows for higher accuracy and model generation with only one fixture component 21.

This sequence of characterization setups requires no short circuit but might require a special start-up for reception (RX). The sequence suffers from lower accuracy.

Figure 7:
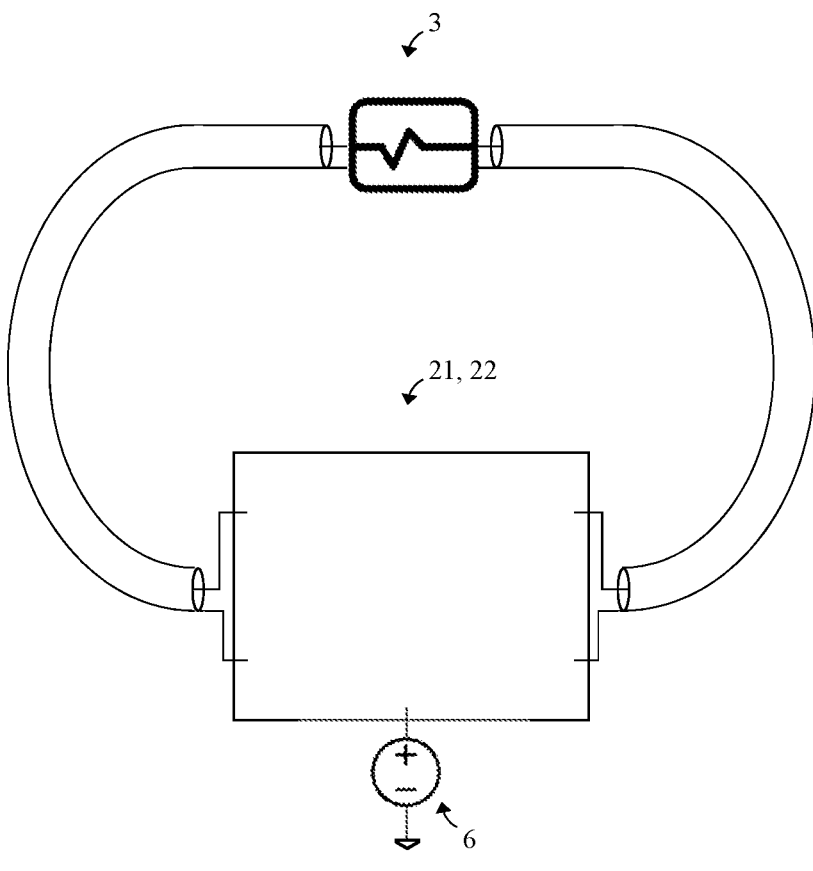
FIG. 7 illustrates a system for characterizing a fixture component of a test fixture.

FIG. 7 illustrates a system 5 for characterizing a fixture component 21, 22 of a test fixture 2.

The system 5 comprises the test instrument 3 for characterizing at least one S-parameter of a plurality of sequentially established characterization setups for the fixture component 21, 22, as well as the fixture component 21, 22.

In accordance with the various characterization setups of FIGS. 8-11 described below, more precise S-parameters may be derived for a single fixture component 21 (lead-in structure) without a mated pair of fixture components 21, 22, i.e., independently from a further fixture component 22 (lead-out structure). Providing 121 an open circuit is most important, whereas providing 122 a short circuit makes the error model more precise. Accordingly, characterization and de-embedding of test fixtures 2 may become more cost-efficient.

The system 5 may further comprise a power supply 6 for supplying electrical power to a device under test, DUT 4, if any.

FIGS. 8-11 illustrate various characterization setups for the fixture component 21, 22 of FIG. 7.

Note that the following considerations apply to both fixture components 21, 22 of the test fixture 2, if they are identical.

FIG. 8 shows a characterization setup in accordance with an "open (circuit)" calibration standard, wherein the DUT interface 212 of the fixture component 21 is left open.

FIG. 9 shows a characterization setup in accordance with a "short (circuit)" calibration standard, wherein the DUT interface 212 of the fixture component 21 may be shorted by a shorting means.

FIG. 10 shows a characterization setup in accordance with a "2X thru" arrangement of directly connected fixture components 21, 22, wherein the DUT interfaces 212, 221 of the fixture components 21, 22 may be connected by mated connectors (not shown).

FIG. 11 shows a characterization setup in accordance with a "DUT" arrangement of the fixture component 21 and the DUT 4, wherein the DUT interface 212 of the fixture component 21 may be connected by its mated connector (not shown) to the DUT 4.

The present disclosure has been described in conjunction with various implementations as examples. However, other variations can be understood and effected by those persons skilled in the art and practicing the claimed matter, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation. A computer program may be stored/distributed on a suitable medium, such as an optical storage medium or a solid-state medium supplied together with or as part of other hardware, but may also be distributed in other forms, such as via the Internet or other wired or wireless telecommunication systems.

The invention claimed is:

1. A process for characterizing a fixture component of a test fixture,
   the fixture component comprising
      a test instrument interface comprising coaxial connector, and
      a device under test (DUT) interface comprising one of a printed circuit board (PCB) trace and a non-coaxial connector;
      wherein the fixture component is configured to mediate between signals of the DUT interface and signals of the test instrument interface,
   the process comprising connecting a test instrument to the test instrument interface;

sequentially establishing a plurality of characterization setups for the fixture component and de-embedding a characterized error model of the fixture component in order to move a reference plane from the test instrument interface to the DUT interface, the plurality of characterization setups comprising two or more, the establishing respectively containing:

providing an open circuit at the DUT interface, and providing a further fixture component of the test fixture at the DUT interface via mated connectors, wherein a corresponding sequence of characterization setups requires no short circuit, and wherein the corresponding sequence of characterization setups requires a start-up for reception (RX); and characterizing at least one scattering(S) parameter of the respectively established characterization setup.

2. The process of claim 1,
the plurality of characterization setups comprising three or more.

3. The process of claim 1,
sequentially establishing the plurality of characterization setups for the fixture component further containing providing a DUT at the DUT interface.

4. The process of claim 1,
the test instrument comprising one of:
a vector network analyzer (VNA), and
a time-domain reflectometer (TDR).

5. The process of claim 1,
the DUT comprising one of:
a printed circuit board (PCB), and
an active electronic device.

6. The process of claim 1,
the fixture component and the further fixture component being identical.

7. A system for characterizing a fixture component of a test fixture,
the system comprising:

the fixture component comprising a test instrument interface comprising a coaxial connector and a device under test (DUT) interface comprising one of a printed circuit board (PCB) trace and a non-coaxial connector, wherein the fixture component is configured to mediate between signals of the DUT interface and signals of the test instrument interface; and a test instrument connected to the test instrument interface for characterizing at least one scattering(S) parameter of a plurality of sequentially established characterization setups for the fixture component and de-embedding a characterized error model of the fixture component in order to move a reference plane from the test instrument interface to the DUT interface, the plurality of characterization setups comprising two or more, the establishing respectively containing:

providing an open circuit at the DUT interface, and providing a further fixture component of the test fixture at the DUT interface via mated connectors, wherein a corresponding sequence of characterization setups requires no short circuit, and wherein the corresponding sequence of characterization setups requires a start-up for reception (RX).

8. The system of claim 7,
the system further comprising a power supply for supplying electrical power to the DUT.

* * * * *